United States Patent [19]

Tseng

[11] 4,181,973

[45] Jan. 1, 1980

[54] COMPLEX CHARACTER GENERATOR

[75] Inventor: Samuel C. Tseng, Yorktown Heights, N.Y.

[73] Assignee: International Business Machines Corporation, Armonk, N.Y.

[21] Appl. No.: 863,976

[22] Filed: Dec. 23, 1977

[51] Int. Cl.² ............... G06F 3/14; G06F 3/12; G06K 15/18

[52] U.S. Cl. ............... 364/900; 340/728; 340/731; 340/750; 340/751; 340/790; 340/799; 340/803; 178/30

[58] Field of Search ............ 364/900 MS File, 523, 364/300, 900; 358/260, 261; 340/324 AD, 731, 748, 750, 751, 803, 804; 178/30

[56] References Cited

U.S. PATENT DOCUMENTS

| 3,521,241 | 7/1970 | Rumble | 358/260 X |
|---|---|---|---|
| 3,936,664 | 2/1976 | Sato | 364/523 |
| 3,980,809 | 9/1976 | Cook | 358/261 X |
| 3,999,167 | 12/1976 | Ito et al. | 364/900 |
| 4,012,735 | 3/1977 | Keane | 340/324 AD |
| 4,068,224 | 1/1978 | Bechtle et al. | 178/30 X |
| 4,125,873 | 11/1978 | Chesarek | 364/900 |

OTHER PUBLICATIONS

Ii, L.B. "Video Data Compaction", *IBM Technical Disclosure Bulletin*, vol. 14, No. 10, Mar. 1972, pp. 3095-3098.

*Primary Examiner*—Raulfe B. Zache
*Attorney, Agent, or Firm*—Jack M. Arnold

[57] ABSTRACT

A character compaction and generation method and apparatus which is particularly adapted to the generation of complex characters such as Kanji characters. A dot matrix defining a given character is compacted into a sparse matrix, with the original character being reconstructed for printing or display from the compacted character defined in the sparse matrix. Each character in the complex character set is compacted and stored in memory one time only, with decompaction being performed each time a given character is to be generated. A set of symbols are defined to represent different patterns which occur frequently in the entire complex character set. Different combinations of the symbols define a given character. The information stored for each sparse matrix representing a given character is comprised of each symbol in the sparse matrix, its position, and its size parameter if the symbol represents a family of patterns which differ only in size.

11 Claims, 20 Drawing Figures

ORIGINAL MATRIX

```
         ──►J
   ........X...........X...........
   ........X..........XXX..........
   .......XXX.........XXX..........
   ..XXXXXXXX..........XX......X....
I  ....................XX.....XXX...
   .........X..XXXXXXXXXXXXXXXX..
   .........XXX........XX..........
   XXXXXXXXXXXX........XX..........
   ....................XX.....X.....
   ....................XX...XXX....
   .........X......XXXXXXXXXXXXX...
   ........XXX.....................
   ..XXXXXXXX....X..............X..
   .............X..............XXX.
   .........X......XXXXXXXXXXXXXXX
   .......XXX.....XX...............XXX
   ..XXXXXXXX..XX..................XX..
   ............XXX...X......X....X....
   ............XXX..XXX...XXX......
   .........X....X...XXX...XXX......
   ..X......XXX......XX....XX.......
   ..XXXXXXXXX......XX....XX........
   ..XX.....XXX.....XX....XX........
   ..XX.....XX......XX....XX........
   ..XX.....XX......XX....XX......X.
   ..XX.....XX......XX....XX......X.
   ..XX.....XX......XX....XX......X.
   ..XX.....XX......XX....XX......XX
   ..XXXXXXXX...XX........XX......XX
   ..XX......XX..X.........XXXXXXXX
   ..XX........XX...........XXXXXX.
```

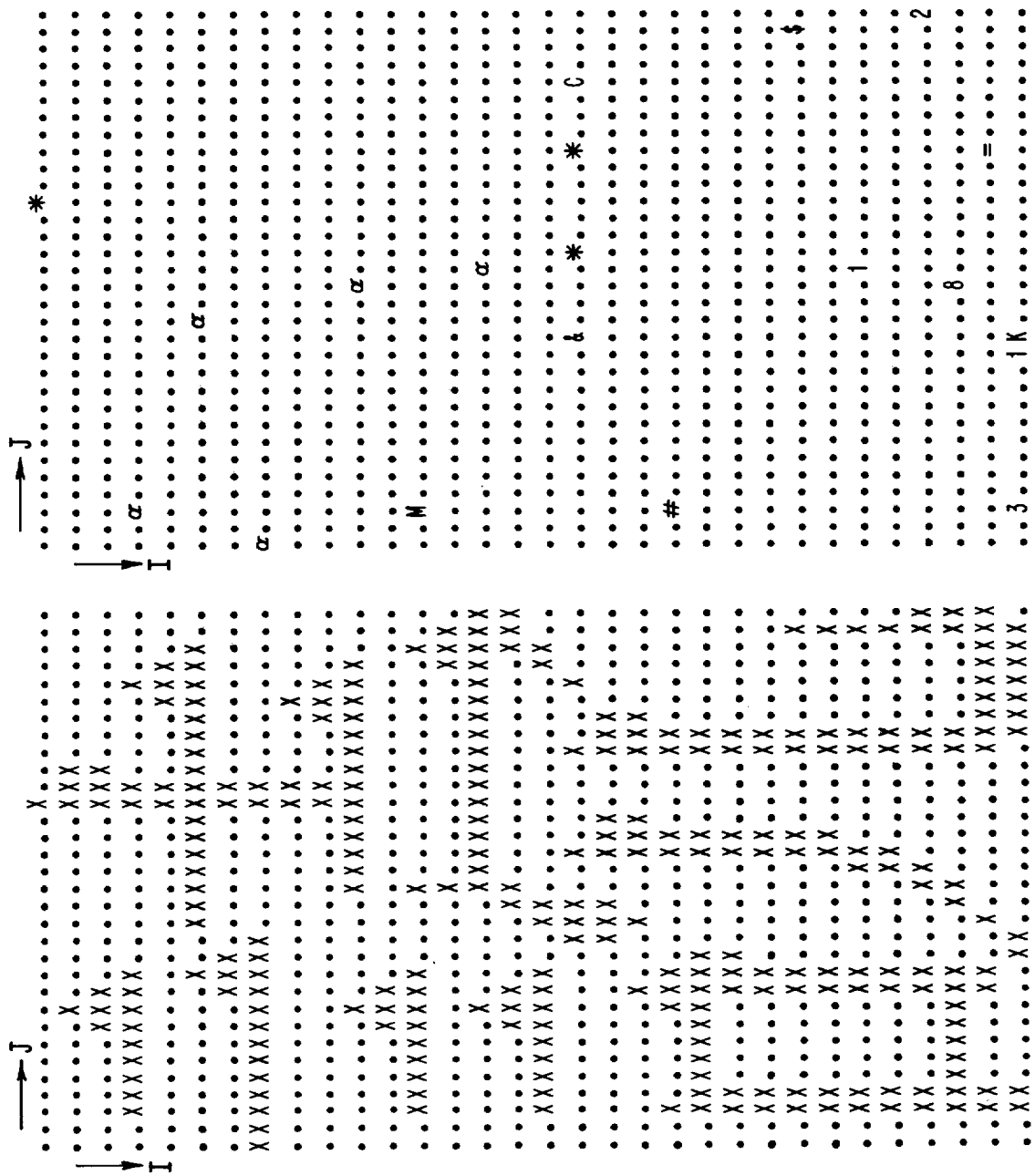
FIG. 2 ENCODED SPARSE MATRIX
FIG. 1 ORIGINAL MATRIX

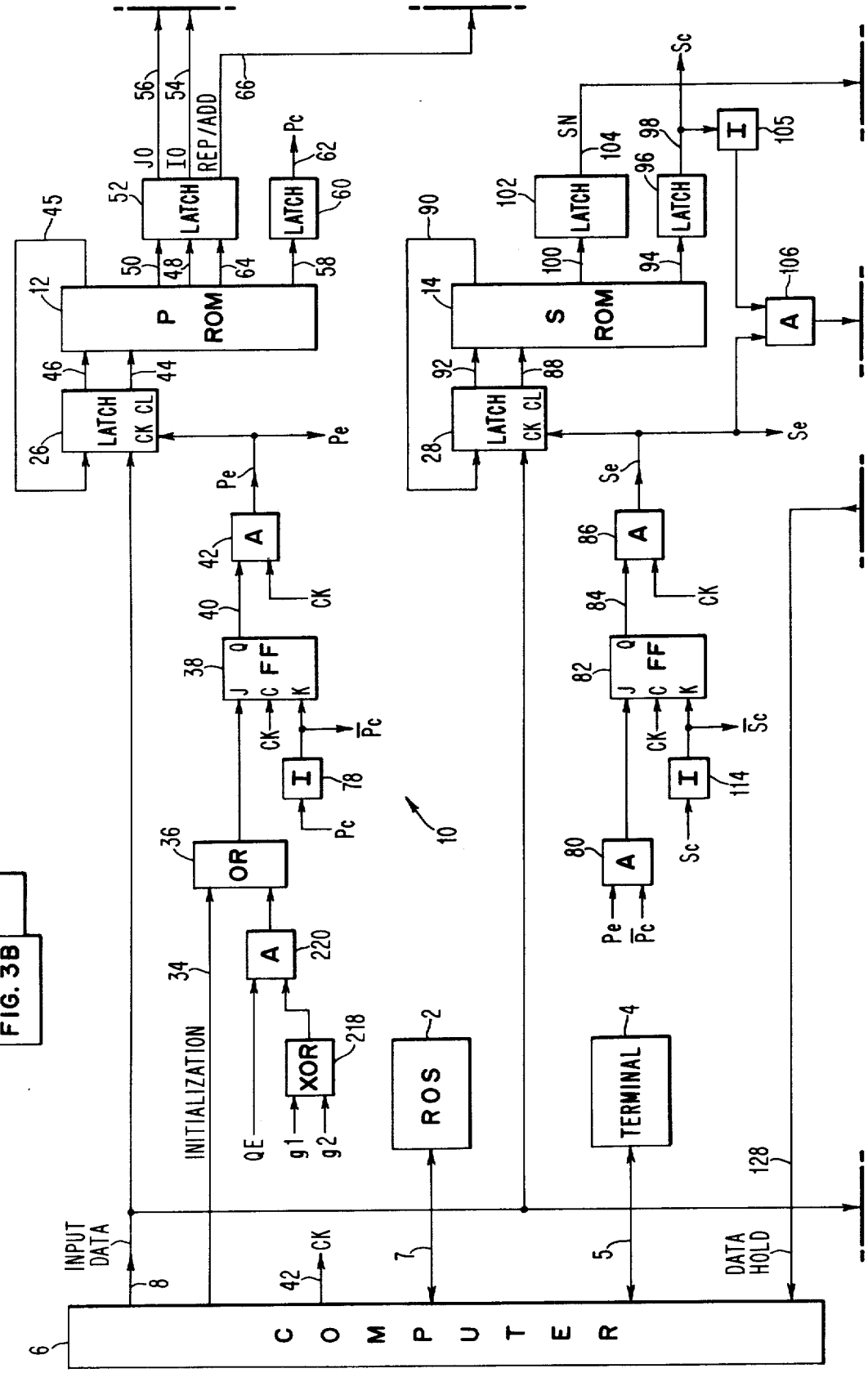

| FIG. 4A | FEEDBACK ADDRESS | DATA FIELD (Io, Jo) | PC |
|---|---|---|---|
| | | | 1 |

P RUN

| FIG. 4B | FEEDBACK ADDRESS | DATA FIELD | PC |
|---|---|---|---|
| | | | 1 |

P FINISHED, TO P

| FIG. 4C | FEEDBACK ADDRESS | DATA FIELD | PC |
|---|---|---|---|
| | | | 0 |

P FINISHED, TO S

| FIG. 5A | FEEDBACK ADDRESS | DATA FIELD | SC |
|---|---|---|---|
| | | | 1 |

S RUN

| FIG. 5B | FEEDBACK ADDRESS | DATA FIELD ADDRESS FOR Q | SC |
|---|---|---|---|
| | | | 0 |

S FINISHED, TO Q

| FIG. 6A | FEEDBACK ADDRESS | DATA FIELD | q1 | q2 |
|---|---|---|---|---|
| | | | 1 | 1 |

Q RUN

| FIG. 6B | FEEDBACK ADDRESS | DATA FIELD | q1 | q2 |
|---|---|---|---|---|
| | | | 0 | 0 |

Q FINISHED, TO Y

| FIG. 6C | FEEDBACK ADDRESS | DATA FIELD | q1 | q2 |
|---|---|---|---|---|
| | | | 0 | 1 |

Q FINISHED, TO P

| FIG. 7A | FEEDBACK ADDRESS | DATA FIELD | YC |
|---|---|---|---|
| | | | 1 |

Y RUN

| FIG. 7B | FEEDBACK ADDRESS | DATA FIELD | YC |
|---|---|---|---|
| | | | 0 |

Y FINISHED, TO Q

FIG. 8

| CODE WORDS | |
|---|---|
| P1 | 0 0 |
| P2 | 0 1 |
| P3 | 1 1 |
| P4 | 1 0 1 |
| P5 | 1 0 0 0 |
| P6 | 1 0 0 1 0 |
| P7 | 1 0 0 1 1 |

FIG. 9

| DECODING P4 (101) | | |
|---|---|---|
| ADDRESS | 0 BRANCH | 1 BRANCH |
| 0 | 1 | 2 ←A |
| 1 | P1 | P3 |
| 2 →B | 3 | P2 |
| 3 | 4 | P4 ←C |
| 4 | P6 | 5 |
| 5 | P5 | P1 |

FIG. 10

| P READ ONLY MEMORY | | | | |
|---|---|---|---|---|
| ADDRESS | IN | ADDRESS FIELD | DATA FIELD | CONTROL FIELD |
| 0 | 0 0 0 0 | 0 0 0 1 | 0 | 1 |
| A→1 | 0 0 0 1 | 0 0 1 0 | 0 | 1 |
| 2 | 0 0 1 0 | 0 0 0 0 | P1 | 0 |
| 3 | 0 0 1 1 | 0 0 0 0 | P3 | 0 |
| B→4 | 0 0 1 0 0 | 0 0 1 1 | 0 | 1 |
| 5 | 0 0 1 0 1 | 0 0 0 0 | P2 | 0 |
| 6 | 0 0 1 1 0 | 0 1 0 0 | 0 | 1 |
| C→7 | 0 0 1 1 1 | 0 0 0 0 | P4 | 0 |
| 8 | 0 1 0 0 0 | 0 0 0 0 | P6 | 0 |
| 9 | 0 1 0 0 1 | 0 1 0 1 | 0 | 1 |
| 10 | 0 1 0 1 0 | 0 0 0 0 | P5 | 0 |
| 11 | 0 1 0 1 1 | 0 0 0 0 | P7 | 0 |

FIG. 11

Q READ ONLY MEMORY

| ADDRESS FIELD | | | | | | | | | DATA FIELD | | | | | | | | | | | CONTROL FIELD | | | |
|---|---|---|---|---|---|---|---|---|---|---|---|---|---|---|---|---|---|---|---|---|---|---|---|
| | | | | | | | | | I | | | | | J | | | | | | W | g1 | g2 | CPH |
| | | | | | | | | | u/D | EIC | RIC | EIL | RIL | u/D | EJC | EJL | RJC | EJL | RJL | | | | |
| 0 | 0 | 0 | 0 | 0 | 0 | 0 | 0 | Q27 | 0 | 0 | 0 | 0 | 0 | 0 | 1 | 0 | 0 | 0 | 0 | 1 | 1 | 1 | 0 |
| 0 | 0 | 1 | 1 | 1 | 0 | 0 | 1 | | 0 | 0 | 0 | 0 | 0 | 0 | 1 | 0 | 0 | 0 | 0 | 1 | 1 | 1 | 0 |
| 0 | 0 | 0 | 1 | 1 | 1 | 0 | 0 | | 0 | 0 | 0 | 0 | 0 | 0 | 1 | 0 | 0 | 0 | 0 | 1 | 1 | 1 | 0 |
| 0 | 0 | 0 | 0 | 1 | 1 | 1 | 0 | | 0 | 1 | 1 | 0 | 0 | 1 | 1 | 0 | 0 | 0 | 0 | 1 | 1 | 1 | 0 |
| 0 | 0 | 0 | 0 | 0 | 1 | 1 | 1 | | 1 | 1 | 0 | 0 | 0 | 1 | 1 | 0 | 0 | 0 | 0 | 1 | 1 | 1 | 0 |
| 0 | 0 | 0 | 0 | 0 | 0 | 1 | 1 | | 1 | 0 | 0 | 0 | 0 | 1 | 0 | 0 | 0 | 0 | 0 | 1 | 1 | 1 | 0 |
| 0 | 0 | 0 | 0 | 0 | 0 | 0 | 1 | | 0 | 0 | 0 | 0 | 0 | 0 | 0 | 0 | 0 | 0 | 0 | 1 | 1 | 1 | 0 |
| 0 | 0 | 0 | 0 | 0 | 0 | 0 | 0 | | 0 | 0 | 0 | 0 | 0 | 0 | 0 | 0 | 0 | 0 | 0 | 1 | 0 | 1 | 0 |
| 0 | 0 | 1 | 0 | 1 | 0 | 1 | 1 | Q42 | 0 | 0 | 0 | 0 | 0 | 0 | 1 | 0 | 0 | 0 | 0 | 0 | 0 | 0 | 0 |
| 0 | 0 | 1 | 1 | 1 | 0 | 0 | 0 | Q27 | 0 | 0 | 0 | 0 | 0 | 0 | 1 | 0 | 0 | 0 | 0 | 1 | 1 | 1 | 1 | ns
COMPLEX CHARACTER GENERATOR

SUMMARY OF THE INVENTION

A method of and apparatus for compacting and generating characters in a complex character set. Each character is described by elements in an m by n element matrix, where m and n are integers which may or may not be equal. A plurality of patterns which occur frequently in the complex character set are defined, with a different symbol being assigned to represent each one of the different patterns. A sparse m by n character matrix is defined for each character in the complex character set in terms of the symbols representing the combination of the different patterns forming the corresponding uncompacted character. For each pattern in a given character, its position in the sparse matrix is represented by its assigned symbol being positioned where a predetermined one of the elements in the corresponding pattern in the uncompacted character matrix is positioned.

BACKGROUND OF THE INVENTION

This invention relates to complex character generators, wherein the complex characters are characters such as Kanji characters, Hebrew characters, Arabic characters or the like. The principles of the present invention are also applicable to any complex pattern. The complex character generator utilizes minimal memory capacity, since the complex characters are compacted, and then decompacted prior to the generation of a given complex character. Heretofore, a certain known complex character generators have generated characters by utilizing a memory where the dot pattern of each character of the character set is stored in a memory. That is, a memory cell is allocated for the storage of each element in a given character. It is seen therefore, that with a corresponding memory cell allocated for each element in the character in a character set, it can be appreciated that the memory capacity is quickly used up in the generation of complex characters. For example, in a 32×32 element matrix, there are 1,024 elements and therefore, it would be necessary to utilize 1,024 bits, that is, 128 bytes to define a given character. Assume therefore, that there is a requirement of on the order of 1,000 bits to generate a given character. If there are 6,000 characters in a given complex character set, it is seen that 6,000,000 storage locations are required to store the information to generate the 6,000 characters. Accordingly, the size and the cost of such a character generation apparatus is prohibitive.

There are a number of known character compaction and generation schemes, which decrease the number of memory locations to generate a given character set, with each having certain advantages and disadvantages. U.S. Pat. No. 3,999,167 to Ito et al discloses method and apparatus for generating character patterns such as Kanji characters. According to the teachings of this patent, every other dot element in a original character matrix is stored, thereby achieving a reduction of ½ in the required memory allocation for the character generator. It is to be appreciated, however, that there is still an appreciable amount of memory utilized for the generation of the Kanji characters according to Ito et al.

U.S. Pat. No. 3,936,664 to Sato discloses a character generator for generating Kanji characters, with a given Kanji character being broken down into a plurality of vectors, with the X and Y location, angle, and the length of the vector being stored. The generated character, however, is only an approximation of the original character, and though a reduction of memory is achieved, the memory space required appears to be excessive.

U.S. Pat. No. 3,980,809 to Cook discloses a character generator, where a library of patterns are stored, wherein the pattern to be generated is compared with a table of reference patterns on an element by element comparison basis until the pattern to be generated is found.

According to the present invention, a character compaction and generation method and apparatus, is disclosed which significantly reduces the required memory allocation for generating characters in a complex character set relative to the character compaction and generation schemes set forth in the prior art. A set of symbols are defined to represent different patterns which occur frequently in the entire complex character set. Different combinations of the symbols define a given character. Therefore, information for a given pattern requires the storage of information relative to a single symbol only for each pattern in a given character. In the prior art, a plurality of elements or vectors are needed to describe each pattern in a given character.

BRIEF DESCRIPTION OF THE DRAWINGS

FIG. 1 is a diagram of an original character matrix for a given Kanji character made up of a plurality of predefined patterns;

FIG. 2 is a sparse matrix representation of the original matrix illustrated in FIG. 1, with each predefined pattern illustrated in FIG. 1 being represented by a single symbol in the sparse matrix of FIG. 2;

FIGS. 3A-3C when taken together as illustrated in FIG. 3, are a block representation of a complex character generator according to the present invention;

FIGS. 4A-4C are diagrams representing the address, data and control fields for the P ROM illustrated in FIG. 3;

FIGS. 5A and 5B are diagrams representing the address, data and control fields for the S ROM illustrated in FIG. 3;

FIGS. 6A-6C are diagrams representing the address, data and control fields for the Q ROM illustrated in FIG. 3, FIGS. 7A and 7B are diagrams representing the address, data and control fields for the Y ROM illustrated in FIG. 3;

FIG. 8 is a representation of typical code words for the P ROM;

FIG. 9 is a table representing how code word P4 of FIG. 8 is decoded;

FIG. 10 is a table representing how the P ROM actually decodes the code word P4; and FIG. 11 is a table representing how the Q ROM decodes the designated symbol from the S ROM for generating the pattern designated by the symbol.

DETAILED DESCRIPTION OF THE INVENTION

Figure 3B:
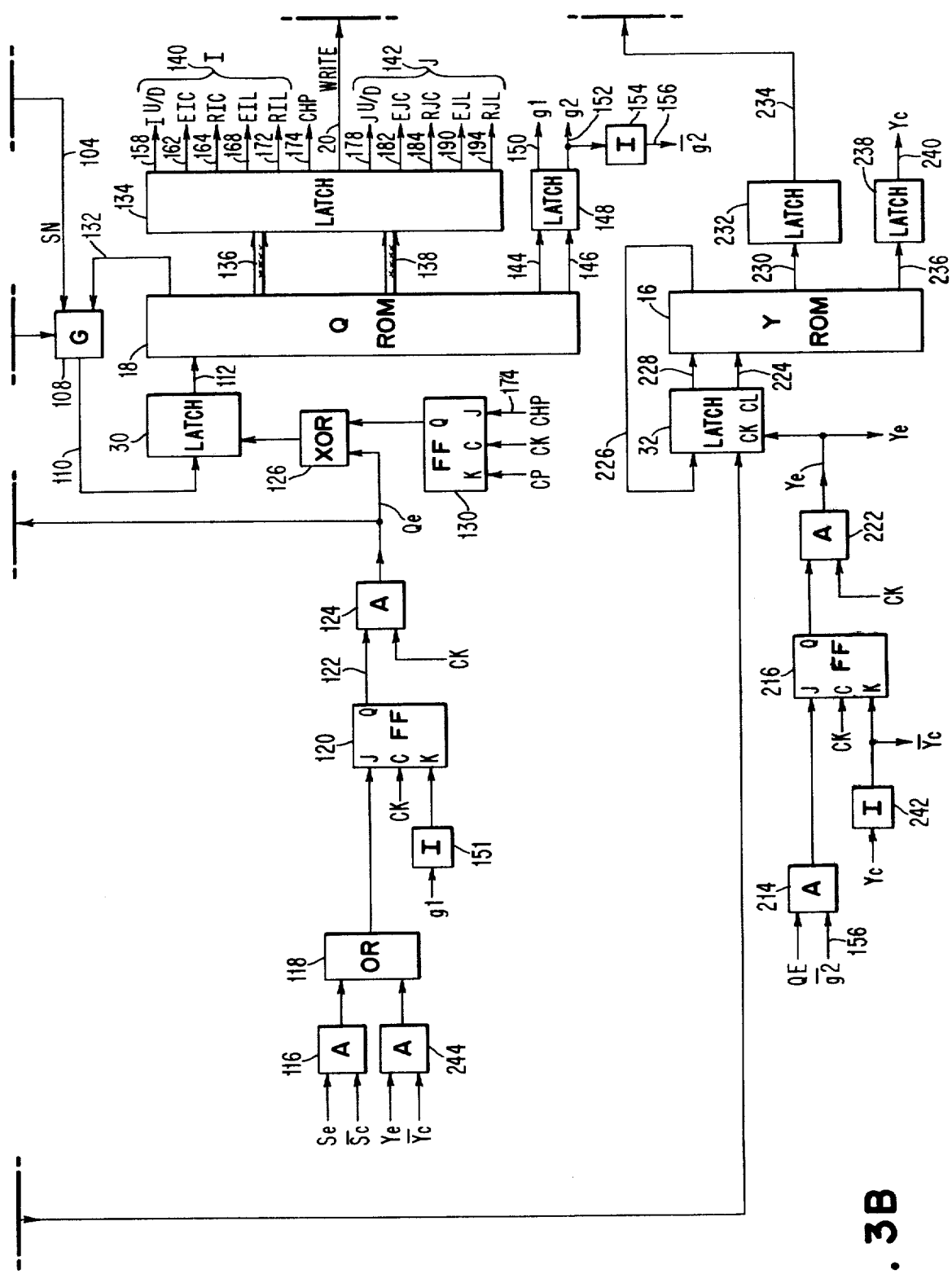

The character generator according to the present invention reconstructs an original character image from compacted data representing the original character. A set of patterns are defined to represent vectors, brush strokes, and partial radicals which appear frequently in the entire complex Kanji character set. Different combinations of the patterns define a given character. For an exemplary complex Kanji character set, there is defined 61 symbols for source encoding representative of 61 patterns, as set forth below. Symbols 1-14 represent some vectors and some more complex patterns which require no size parameter since their size is fixed. Symbols 42-53 represent vectors of length exceeding 6 units, and also brush strokes with 1 size parameter in either the vertical or horizontal direction. Note that an X represents a black picture element (pel), and that the arrow symbol (→) denotes where a symbol representative of that pattern is positioned in a sparse matrix when utilizing a vertical scan. Symbols 54-61 represent patterns with 2 size parameters.

| SYMBOL | DEFINITION OF SYMBOLS |
|---|---|
| 1 | a single unit element →X. |
| 2 | single width vertical vector with a length of 2 units $\begin{smallmatrix}\to X\\X\end{smallmatrix}$. |
| 3 | single width horizontal vector with a length of 2 units →XX. |
| 4 | single width +45° diagonal vector with a length of 2 units →X$^X$. |
| 5 | single width −45° diagonal vector with a length of 2 units →$^X$X. |
| 6 | single width vertical vector with a length of 3 units. |
| 7 | single width horizontal vector with a length of 3 units. |
| 8 | single width +45° diagonal vector with a length of 3 units. |
| 9 | single width −45° diagonal vector with a length of 3 units. |
| 10 | single width vertical vector with a length of 4 units. |
| 11 | single width horizontal vector with a length of 4 units. |
| 12 | single width +45° diagonal vector with a length of 4 units. |
| 13 | single width −45° diagonal vector with a length of 4 units. |
| 14 | single width vertical vector with a length of 5 units. |
| 15 | single width horizontal vector with a length of 5 units. |
| 16 | single width +45° diagonal vector with a length of 5 units. |
| 17 | single width −45° diagonal vector with a length of 5 units. |
| 18(&) | single width vertical vector with a length of 6 units. |
| 19 | single width horizontal vector with a length of 6 units. |
| 20 | single width +45° vector with a length of 6 units. |
| 21 | single width −45° vector with a length of 6 units. |

| Symbol | Pattern | Symbol | Pattern |
|---|---|---|---|
| 22 | →XXXXXXX<br>XXXX<br>X | 23 | →X<br>XXX<br>XXXX |
| 24 | X<br>XX<br>→XXXX | 25 | →XXXXX<br>XXX<br>X |
| 26 | →X    XX<br>XXXXXXX<br>XXXXX<br>XX | 27 | X<br>XXX<br>→XXXXX |
| 28 | →XXXXXXXX<br>XXXXX<br>XX | | |
| 29 | →X<br>XXX<br>XX | 30 | →X<br>X<br>XX<br>XX<br>XXX<br>X |
| 31 | X<br>XX<br>→XX | 32(C) | XXX<br>XX<br>→X |

-continued

```
33    →X                      34         X
       X                                  X
       XX                                 XX
       XX                                 XX
       XX                                 XX
                                          X
                                         →X

35    →X                      36    →XX
       XX                            XX
       XXX                           XX
                                     XX

37    →XX                     38         X
       XX                               XX
       XX                              XXX
                                    →XXX

39(&)     X                   40    →X
          X                          XX
          X                          XXX
          XX                          XXX
          XX                           XXX
      →XXX                              X
       XXX
       X

41           XXX
         →XXXXXX
           XXXX
            XX
             X

42(α)                         43                X
             X                                XXX
            XXX                              XXXXX
      →XXXXXXXXXXXXXX         →XXXXXXXXXXXXXXXXXXX
       !--------q---------!      !-----------q-!

44(=)  !----------q-----------!  45
      →XXXXXXXXXXXXXXXX                         XX
       XXXXXXXXXXXXXX             →XXXXXXXXXXXXXXXX
                                    !--------q--------!

46($)         →X              47(*)       →XXX
           -   XXX                    -    XXX
           !   XXX                    !    XX
           !   XX                     !    XX
           p   XX                     p    XX
           !   XX                     !    XX
           -   XX                     -    XX

48            →X              49          →XX
           -   XX                     -    XX
           !   XX                     !    XX
           !   XX                     !    XX
           p   XX                     p    XX
           !   XX                     !    XX
           -   XX                     -    XX
```

50     single width vertical vector with a length of "p" units where p is an integer $\geq 7$.

51     single width horizontal vector with a length of "p" units where p is an integer $\geq 7$.

52     single width +45° diagonal vector with a length of "p" units where p is an integer $\geq 7$.

53     single width −45° diagonal vector with a length of "p" units where p is an integer $\geq 7$.

```
54(#)    !---------q----------!   55     !---------q-----------!
                 X
           X     XXX                   →X            XX
       --  XXXXXXXXXXXX              --  XXXXXXXXXXXX
       !   XX      XXX               !   XX      XXX
       !   XX       XX               !   XX       XX
       !   XX       XX               !   XX       XX
       p   XXXXXXXXXXXX              p   XXXXXXXXXXX
       !   XX       XX               !   XX       XX
       !   XX       XX               !   XX       XX
       !   XX       XX               !   XX       XX
       !   XXXXXXXXXXXX              !   XXXXXXXXXXX
       -- XX        XX               --  XX        XX 56                                57
```

-continued

```
            !------- q --------!
                    X
         →X        XXX                              !--------q---------!
         -- XXXXXXXXXXXXXXXXX                                XX
         !     XX       XXX                       →X        XXXXXXXXXXXXXX
         p     XX       XX                        -- XX              XXX
         !  XXXXXXXXXXXXXXXXX                     !  XX              XX
         --    XX       XX                        p  XX              XX
 58                              59               !  XXXXXXXXXXXXXX
                                                  -- XX              XX
             !--------- q ---------!
                       X                            !---------q---------!
                      XXX                                   XX
         →XXXXXXXXXXXXXX                          →XXXXXXXXXXXXXX
                      XXX --                                XXX --
                      XX  !                                 XX  !
                      XX  p                                 XX  p
                      XX  !                                 XX  !
                      XX  --                                XX  --
 60                              61(M)
                                                        X
                                                       XXX
              →XXXXXXXXXXXXX             →XXXXXXXXXXXXXX
              --                         --
              !                          !
              p                          p       X
              !                          !      XXX
              -- XXXXXXXXXXXXX           --XXXXXXXXXXXXXX
                 !--------q---------!       !---------q---------!
```

Refer to FIG. 1 which is an exemplary original complex Kanji character image in a 32×32 dot matrix form. Each dot in the original matrix is representative of where a white picture element (pel) is situated. Each of the patterns forming the Kanji character may be represented by a symbol 1 to 61 from the above table. The original matrix of FIG. 1 then may be reduced to a sparse matrix as illustrated in FIG. 2: The information stored, which is the compaction of the sparse matrix of FIG. 2 is:

(1) The non-zero elements, that is the symbols representative of the patterns forming the character in the matrix of FIG. 1.

(2) The positions of the symbols in the sparse matrix.

(3) The size parameters, if the symbols represent a family of patterns which are different only in size. That is, the patterns 42–61.

The information on the position of each symbol in the sparse matrix is defined as follows. The sparse matrix is scanned vertically (i=1 to 32) from the leftmost column (j=1) to the rightmost column (j=32). If the first non-zero element, that is the symbol representative of the pattern, is at (I=i, J=1) as denoted by the → in the pattern table, the position of this symbol is defined by K=i, where K=1 to 32. If the symbol concerned is on K=i to 32 of the same column as the previous symbol, the position of the present symbol is defined by the relative distance from the previous symbol. The maximum possible value is 31 and the same code words K=1 to 32 are used. If the symbol concerned is Δj columns to the right of the previous symbol, and I=i, the position of the symbol is represented by 2 parameters, i.e., (Δj, i,). The same 32 code words are used for both i and aforementioned K, and another 32 words for Δj. That is, the total number of code words for position is 64. Since the maximum possible length of a vector is 32 in the 32×32 matrix, there are 32 possible code words for the size parameters I and J. In summary, there are 3 sets of code words, 61 for the symbols, 64 for the position, and 32 for the size parameters.

Thus, we have 3 sets of code words respectively, for P (position), S (symbol) and Y (size). Code words, such as HUFFMAN code words may be generated to describe the information. Shorter words are assigned to the symbols with higher probability of occurrence and longer words for symbols having a lower probability of occurrence. Once the 3 sets of code words are defined, the sparse matrix can be vertically scanned into a sequence of symbols as set forth below, with reference to FIG. 2.

| P | S | Y | P | S | Y | P | S | Y | P | S | Y | |
|---|---|---|---|---|---|---|---|---|---|---|---|---|
| 8 | α | 8 | (2,4) | α | 4 | 9 | M | (4,4) | 8 | # | (7,10) | ... etc. |

(P) Position 8 = 000111
(S) Symbol  42(α) = 1100
(Y) Size 8       = 0001
   Bit stream for the position 8 symbol = 0001111000001

It is seen that each symbol in the sparse matrix of FIG. 2 represents one of the defined patterns in the matrix of FIG. 1. For example, as one scans in the vertical from the leftmost column (j=1), to position 8, the first symbol α is located which is representative of the pattern 42 which begins at this position. The pattern of this location has a size parameter q of 8. This is readily ascertained by referring to pattern 42(α) which illustrates how q is counted. Next, as the matrix of FIG. 2 is scanned in the vertical direction, the symbol α representative of pattern 42 is next encountered in the third column at position j=2 removed from the first encountered symbol and i=4 from the top of the vertical scan. The next encountered symbol in the vertical scan is symbol M representative of pattern 61. The symbol M is at position 9 with reference to the last encountered symbol α and has size parameters q=4, P=4. The next encountered symbol in the vertical scan is symbol # which is representative of pattern 54. The symbol is at a position 8 with reference to the last encountered symbol M and has a size parameter q=7, P=10. The parameters of the rest of the symbols in the compacted matrix may be ascertained accordingly. It is to be appreciated that the position symbol and size parameters may be described in binary form, as set forth above for symbol α at position 8, such that the sparse matrix is compacted into a shorter binary bit stream, and may be stored in a read-only storage device, with the compacted character being retrieved at a later time. For each character in the complex Kanji character set a sparse matrix is formed and compacted into a shorter binary bit stream as compacted character data, as above.

Thus, by way of example only, if the complex character set is comprised of 600 characters, there are 600 compacted characters stored in a read-only storage device for later retrieval. A given complex character is read out from the read-only storage as a binary bit stream as set forth above.

Figure 3C:
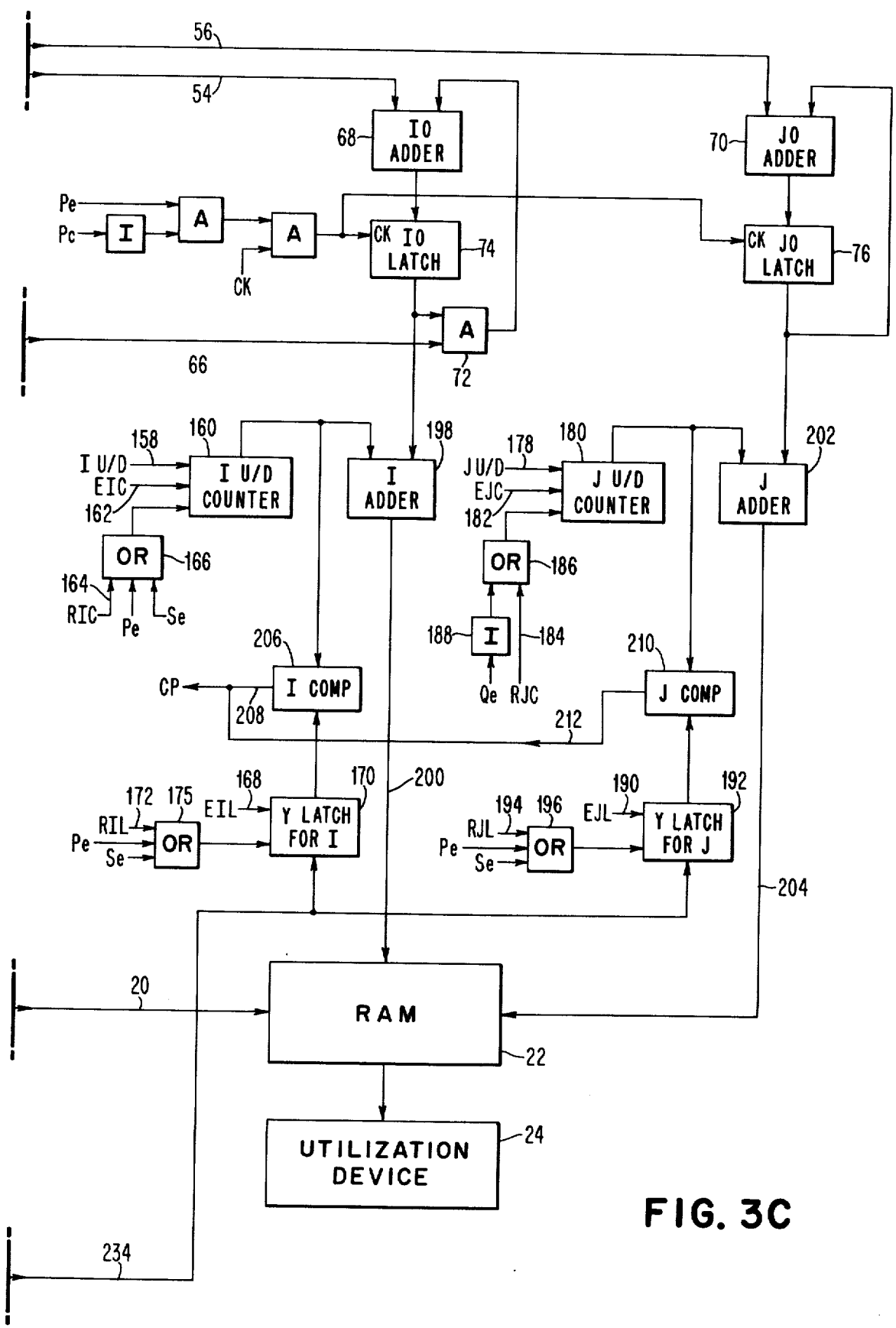

Refer now to FIG. 3, which is a block diagram representation of the character generator according to the present invention. The compacted 600 complex Kanji characters are stored in a binary manner in a read-only storage (ROS) device 2, which for example, may be a magnetic disk, magnetic tape, semiconductor storage, or any other known read-only storage device. Whenever a given character is needed for reproduction, a terminal device 4 such as an on-line typewriter or the like, requests that a computer 6 retrieves the selected character via a line 7 from the read-only storage device 2. The binary bit stream representation of the selected character is provided as input data via a line 8 to a character decompactor or decoder which is illustrated generally at 10.

The decompactor portion of the complex character generator includes four read-out memories (ROM'S). A P ROM 12 decodes the input data bits to yield the position of the non-zero elements, that is, the symbols in the sparse matrix representative of the selected character. A S ROM 14 decodes the input data bits to determine the symbol representative of the pattern to be generated. A Y ROM 16 decodes the input data bits to yield the size parameter of the pattern represented by this symbol, if a size parameter is included. A Q ROM 18 has the defined 61 patterns stored therein which are used in a predetermined manner to form a given character. The Q ROM 18 generates a write command on a line 20 which writes on a random access memory (RAM) 22 the pattern specified by the S ROM 14 output, with this pattern then being written on a utilization device 24, which for example, may be a display device or a printer device. The printer device, for example, may be a non-contact printer such as a wire printer, thermal printer, ink jet printer, ink mist printer, etc. Only one of the four ROMs is enabled at a time. The ROMs are activated by the lines Pe, Se, Qe, and Ye one at a time, which permit latches 26, 28, 30, and 32 to be enabled in a predetermined manner such that the input data on line 8 may be selectively applied to the respective ROMs. These lines are controlled by the control bit in the respective ROMs. This is to be explained in more detail shortly. The address, data and control fields of the respective ROMs are illustrated in FIGS. 4–7.

The general operation of the decompactor 10 will now be described with a more detailed description subsequently being given relative to the generation of patterns 27 and 42 in relation to the sparse matrix of FIG. 2. The convention is adopted that when a device is providing a binary "1" output the device is high, and when providing a binary "0" output is low. The input data on line 8 is a binary bit stream indicative of the selected complex character in its compacted form. This bit stream in sequence provides the binary data representative of the position (P), the symbol (S) and the size parameter (Y), if needed, of each pattern forming the selected complex character. This input data is provided to the latches 26, 28 and 32, with the input data then being channeled to the respective ROMs at predetermined times. Once the compacted character is selected from the ROS 2 by the terminal 4, the computer 6 provides an initialization pulse on a line 34 which is passed by an OR gate 36 to the J terminal of a JK flip-flop 38, setting the flip-flop 38 to the one condition, providing a high output on a line 40. The computer 6 provides clock pulses CK on a line 42, and with the occurrence of a clock pulse concurrent with the line 40 being at a high level, an AND gate 42 provides the Pe signal to the clock terminal of the latch 26 permitting the latch 26 to provide the input data stream via a line 44 to the P ROM 12. The data bit on the line 44 is directed to a first address in the P ROM 12, and in response thereto a binary bit is provided on an output line 45. The binary bit on line 45 is provided to a second input of the latch 26. The latch 26 then provides a signal on a line 46 for directing the next input bit to another address in the P ROM 12. That is, the input bits on line 44 are concatenated with the bits on the line 46 to scan the P ROM 12 to find the position at which the pattern is to be generated. This is to be explained in more detail shortly. The I0 and J0 outputs of the P ROM are provided on lines 48 and 50 to a latch 52, with the I0 and J0 outputs of the latch appearing on lines 54 and 56 respectively. The control bit from the ROM 12 appears on line 58 for setting a latch 60, with the control bit Pc of the P ROM appearing on an output line 62. A replace AND signal (REP/ADD) appears on an output line 64, and on an output line 66 from the latch 52. It is to be appreciated that there is a separate latch for each connected line thereto, and that each output line consists of a plurality of lines, one such line for each bit. While the P ROM is active searching for the I0 and J0 of the symbol, the control bit Pc is one as indicated in FIGS. 4A and 4B. The I0 signal is applied to a first input of an I0 adder 68 and the J0 signal is provided to a first input of a J0 adder 70. If the present I0 signal is to be added with a previous I0 signal, a high level (ADD) is present on the line 66 enabling an AND gate 72 to pass the output from the I0 latch 74 to the second input of the I0 adder 68 such that the present I0 position is added to the previous I0 position. On the other hand, if the line 66 is low (REPLACE), the AND gate 72 is disabled and the previous I0 signal is replaced by the new I0 signal. The output of the J0 adder is applied to a J0 latch 76, and the output of the J0 latch is fed back to a second input of the J0 ladder 70 such that successive J0 positions are added to one another. This is so, since the matrix is scanned in a vertical direction. Once the P ROM determines the I0, J0 position, the Pc control bit becomes zero as illustrated in FIG. 4C, and this signal is inverted by an inverter 78 with the resultant high signal being applied to the K terminal of the flip-flop 38 setting same to the zero state, with the output of the AND gate 42 going low in response to the change of state, such that the Pe signal is low and the latch 26 is disabled.

At the time the $\overline{Pc}$ signal goes high and the Pe signal is still high an AND gate 80 is enabled for this short duration to provide a pulse to the J terminal of a JK flip-flop 82 setting same to the one state. The high output on the line 84 thereof is passed by an AND gate 86 at the next clock pulse (Ck) time such that the Se line now is high, enabling the latch circuit 28 to pass the input data indicative of symbol information to the S ROM 14. The input bit is passed by the latch 28 on a line 88 to the S ROM 14 to a first address therein, with the input bit being concatenated with this address and being fed back on a line 90 to a second input of the latch 28, with the output signal on line 92 from the latch 28 then pointing at a second address in the S ROM 14, and so on until the selected symbol is determined. During this selection process, the control bit Sc from the S ROM 14 is high on a line 94, setting a latch 96, with the Sc signal being provided on the output line 98 as indicated in FIG. 5A. When the symbol indicated by the input data is found, an output signal is provided on a line 100 from the S ROM 14 setting a latch 102 with a signal Sn being provided on the output line 104 indicating that the symbol has been determined. The signal Sn is the address of the pattern in the Q ROM. When the symbol is determined, the control bit Sc goes to zero as indicated in FIG. 5B and is inverted by an inverter 105 with this high signal being applied to a first input of an AND gate 106. At this time, the Se bit is still high and is applied to the second input of the AND gate 106 causing a high output therefrom to the enable input of a gate 108. The Sn signal is passed via the enabled gate 108 on a line 110 to the input of a latch 30, with the latch 30 then passing a signal indicative of which address Qn in the Q ROM the pattern is situated. When the Sc control bit goes low, this signal is inverted by an inverter 114, with the resultant high signal being provided to the K terminal of the flip-flop 82, setting same to the 0 state, thus disabling the AND gate 86 and causing the Se line to go low disabling the latch 28 and the AND gate 106.

At the time the $\overline{Sc}$ signal goes high and the Se signal is still high, an AND gate 116 is enabled for this short duration thereby passing a pulse through an OR gate 118 to the J terminal of a JK flip-flop 120, setting same to the 1 state.

The output of J-k flip-flop 120 on line 122 then goes high, and at the next CK pulse AND gate 124 passes the Qe pulse to an exclusive OR gate 126, and a data hold signal on the line 128 to the computer 6. The data hold signal indicates to computer 6 that data is to be held while Q ROM is in operation, since the Q ROM does not need data input from the computer. The exclusive OR gate 126 passes the Qe pulse to set the latch 30. The second input to the exclusive OR gate 126 is from the J-k flip-flop 130 which is in the 0 state at this time since the flip-flop is initially reset to the 0 state and has not received a CHP pulse. Once the latch 30 is set, and the pattern is selected in the Q ROM via line 112, the output line 132 receives signals indicative of which elements in the pattern are to be written at successive times. Since the gate 106 is disabled at this time, the Sn signal on line 104 is blocked, and the signal indication on line 132 is then fed back on the line 110 to the latch 30 with the Q ROM then stepping to successive locations for writing the different positions and for controlling certain counters and latches in the circuit.

A latch 134 receives signal outputs on lines 136 and 138 from the Q ROM 18 which are indicative of I and J control parameters as well as the write signal appearing on line 20. Control bits are provided on output lines 144 and 146 to a latch 148 for providing control signals g1 and g2 on output lines 150 and 152, respectively, with the g2 signal being provided to an inverter 154 for providing a $\overline{g2}$ signal on an output line 156. The g1 signal is provided to an inverter 151 for providing a $\overline{g1}$ signal, which is used to reset flip-flop 120. The IU/D signal on line 158 is provided to an IU/D counter 160, with the counter 160 counting up when the line 158 is low (0) level, and counting down when the line 158 is high (1). The EIC signal on line 162 is an enable signal, which enables the counter 60 to count when line 162 is high, and which disables the counter when the line 162 is low. The line 164 RIC is a reset signal which is provided to an OR gate 166, with the signal being used to reset the counter 160 whenever the line 164 is high. The counter 160 is also reset when the Pe, or the Se signal applied to the OR gate 166 is high. This occurs when the P ROM or the S ROM is active, which indicates that the Q ROM cycle has been completed. The EIL signal appearing on line 168 is an enable signal for enabling the Y latch for I, 170 when the line 168 is high. The RIL line 172 is a reset signal which is applied to an OR gate 175 for resetting the latch 170 when the line 172 is high. The OR gate 175 provides a reset signal to the latch 170 whenever the Pe or the Se signal is high which indicates that the Q cycle is complete. A CHP signal is generated on a line 174 when the latches 170 or 192 are enabled, thereby setting the flip-flop 130 so the Q ROM is disabled until the counts in the counters 160 or 180 compare with the counts stored in latches 170 or 192, respectively.

The JU/D signal on line 178 is applied to the JU/D counter 180 for causing the counter 180 to count up when the line 178 is low and to count down when the line 178 is high. The EJC signal on line 182 is applied to the counter 180 for enabling same when the line 182 is high and for disabling same when the line 182 is low. The RJC signal on line 184 is applied to an OR gate 186 and is passed to reset the counter 180. The Qe signal is inverted by an inverter 188 and is used to reset the counter 180 whenever the Q circuit is active. An EJL signal on line 190 enables the Y latch for J, 192 when this line is high and disables same when it is low. An RJL signal on line 194 is passed as a reset signal by an OR gate 196 for resetting the latch 192 when this signal is high. The OR gate 196 also passes a reset signal whenever the Pe or Se signals are high, which indicates that the Q network is not active.

The outputs of I0 latch 74 and IU/D counter 160 are provided to first and second inputs respectively, of an I adder 198, with the output of the adder 198 being provided to the RAM 22 via a line 200. The outputs of the J0 latch 76 and the JU/D counter 180 are applied to first and second inputs respectively, of a J adder 202 with the output thereof being applied to the RAM 22 via a line 204. The output of the IU/D counter 160 and the Y latch for I, 170 are applied to first and second inputs, respectively of an I comparator 206, with the output of the comparator 206 appearing on a line 208 whenever the count of the counter 160 matches the count in the Y latch 170 which indicates that the correct size parameter has been generated in the I direction.

The output of the JU/D counter 180 and the Y latch for J, 192 are applied to respective inputs of a J comparator 210 which provides an output signal on a line 212 whenever the count in the counter 180 matches the number stored in the latch 192, which is indicative of the size parameter in the J direction having been correctly generated. The signals appearing on lines 208 and 212 are indicated as signal CP which is indicative that the respective I or J size parameter is correctly generated, which signal is then used to reset the flip-flop 130, which lets the exclusive OR gate 126 to pass the Qe signal to the latch 30 such that the Q ROM may then generate the remainder of the pattern. It is seen therefore, that the elements written on the RAM 22 and in turn on the utilization device 24 are the successive element positions for a given pattern as indicated as the outputs of the I adder 198 and the J adder 202 whenever the write signal on line 20 is high.

Consider now, how the P ROM 12 operates, with it being understood that the S ROM 14 operates in a similar manner. The P ROM is comprised of a P table having a plurality of code words stored therein which are representative of the 32×32 positions in the sparse matrix. Likewise, the S ROM 14 is comprised of a S table having a plurality of code words stored therein which are representative of symbol information. For ease of understanding, only a few representative code words are illustrated. FIG. 8 illustrates code words P1 through P7, and FIG. 9 illustrates how code word P4 (101) is decoded. Consider FIG. 9 in conjunction with FIG. 3. The latch 26 is pointing at address 0 via line 46 in P ROM 12. The first input bit is a binary 1 as manifested on line 44. Therefore, the P ROM goes to the 1 branch with the line 46 then pointing at the address 2 as indicated by arrow A. The address 2 as now manifested on line 46 is concatenated with the next bit, which is a 0 bit appearing on line 44, and the P ROM goes to the 0 branch which now points at address 3 as indicated by arrow B. Address 3 now appears on line 46 and is concatenated with the 1 bit now appearing on line 44 which points at the 1 branch which now points at P4 as indicated by arrow C. P4, for example, is a position 4 which is indicative of the I0 and J0 positions of the symbol in question, and is now manifested on the lines 54 and 56 from the output of the latch 52. The appropriate REP/ADD and Pc signals are also manifested at the output of the P ROM.

FIG. 10 illustrates in detail how the P ROM operates to decode the input binary bits 101 indicative of the position P4. Since a memory has to be configured in a binary manner, the branches must be indicated successively. Therefore, addresses 0 and 1 are the same, with the input bits of 0 and 1 respectively, indicating the 2 states, that is, which of the 2 branches that the input bit is concatenated with. At initialization, all the latches and the circuits are cleared, and the feedback lines 44 are all zeros to start the P ROM. Consequently, the first input bit (IN column) of 1 completes an address of 00001 (address column) as indicated at address 1 by arrow A. At this location the content of the data field is 0, meaning that a code word is not yet decoded and more input bits are required to determine the P location. The control field bit Pc is 1 indicating that the P ROM will be active in the next clock cycle to continue the search for the P location. The content of the feedback address field is 00010. This is concatenated with the next incoming bit 0 (IN column) as indicated at address 4 by arrow B to complete the next address of 00100. At address 00100, the content of the data field is again 0, and the control bit Pc is again 1, and the content of the address field is 0011, indicating the feedback address. This 0011 concatenates with the next incoming bit 1 to complete the next address field of 00111 as indicated at address 7 by the arrow C. At this address 00111, the data field contains P4 meaning that the input bits have been decoded to yield P4 representing the values of I0 and J0, the location of the non-zero element, the symbol, in the sparse matrix. The feedback address field at this P ROM location is now 0, thus the P ROM is reset to the initial state ready for the next operation when the P ROM is enabled. The control field bit Pc is now 0 meaning that the P ROM should be disabled and the S ROM is to be enabled in the next clock cycle.

The operation of the S ROM 14 is similar to the operation of the P ROM. The data field content Sn is, however, the address of the nth pattern in the Q ROM as indicated in FIG. 5B. For example, assuming that the Q ROM contains on the order of 400 ROM words, for 61 patterns, the data field is 9 bits wide. Assuming the 27th pattern (Q27) starts at address 59, then the output data S27 in the S ROM is 000111011. The S ROM is disabled only when the control bit SC is changed from 1 to 0 in the S ROM. This change also selects the feedback address into the Q ROM to be the output from the S ROM by AND gate 106 being enabled. Thereafter, the Q ROM becomes active and the feedback is selected from the content of the feedback address in the feedback address field in the Q ROM. The Q ROM is started at the location specified by Sn, in this instance S27. The fact that the Q ROM is active holds the input bit string from coming into the decoder 10 since the data hold signal on line 128 is high.

FIG. 11 is a partial table of the Q ROM which is an exemplary representation of its operation. The first 9 lines write pattern 27 on the RAM, and the last 2 lines combined with the first 9 lines writes the pattern 42 on the RAM. The writing of the other patterns can be determined in a like manner. The first line in the list writes a 1 on the RAM, the position of which is specified by the I0, J0 from the P ROM. These signals are stored in the I0 and J0 latches 74 and 76, respectively. The write bit (W) is a 1 which permits writing. EJC is also a 1 which enables the J up/down counter to count 1 since EJL is a 0. Therefore, the J up/down counter 180 counts to 1 and adds this to the 1 in the J adder 202. This increments 1 in the J direction. Thus, when the second line is read, the write command W in the second line is again a 1 and writes a 1 in the RAM at (I=I0, J=J0+1), and at the same time EJC is a 1 causing the J up/down counter to increment again. This continues until the 5th line in the list. By this time there are 5 points written in the RAM from (I0, J0), to (I0, J0+4), and on the same line there is a 1 in the U/D of the J counter. This sets the up/down counter to decrement, and EJC being 1 enables the J counter to decrement 1. Similarly, a 1 in the U/D and 1 in the EIC also decrements the IU/D counter, thus the IJ positions are now at (I0-1, J+4-1). Therefore, by the time the Q ROM reaches the 6th line in the list, another 2 points are written at (I0-1, J0+4-1) and (I0-2, J0+4-2). By keeping in mind that 0 in the up/down counter means increment, and 1 means decrement, and 0 in EIC for disable and 1 for enable the counters, one can easily see that the above 9 lines in the Q ROM complete the pattern 27 as indicated below.

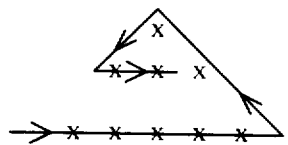

Next, it will be explained how the pattern 42 is generated. The S ROM output indicates the address S42 and starts the Q ROM starting at the address Q42, i.e., the 10th line in the list illustrated in FIG. 11. In this line there is a 1 in the EJL, meaning that the J latch is enabled so that it is ready to accept the output from the Y ROM, which is indicative of the J size parameter— q—as indicated in the Definition of Symbols table. There is a 0 in the write command meaning "do not write" in the next cycle. Also, g1=0 and g2=0 which disables the Q ROM and starts the Y ROM. The Y ROM decodes the input data bits to yield the size parameter and outputs them to the I and J latches 170 and 192, respectively. Since only the J latch is enabled, the output from the Y ROM is stored in the J latch only. When the storage is complete, the control bit Sc of the S ROM changes from 1 to 0 and disables the S ROM and starts the Q ROM. The Q ROM continues to start at the next line, the 11th line in the above example. In this line, the EJC is a 1, thus the J counter starts to count and increment the J value. Also, the CPH is a 1, which holds the Qe from enabling the Q ROM, since the flip-flop 130 is in the 1 state disabling the exclusive OR gate 126. Therefore, the Q ROM is disabled while the counter is counting, with the comparator comparing the counter output with the content of the J latch. Therefore, the circuit continues to write a 1 into the RAM to draw a horizontal line equal to —q—for pattern 42, until the output of the counter is equal to the content of the J latch. At this instant, the comparator issues a signal CP which clears the comparator hold signal CHP by resetting the flip-flop 130, such that the Qe is passed by the exclusive OR gate 126 to enable the latch 30 such that the Q ROM will once again operate. Since the feedback address field in the 11th line contains the address for Q27, the Q ROM will continue to execute the pattern 27 as set forth above, thus completing the pattern 51, since the pattern 51 is a horizontal line terminated by pattern 27.

It is seen therefore, that any of the compacted complex characters stored in the ROS 2 may be decompacted and generated by the network 10 in a manner similar to that set forth above.

What is claimed is:

1. In character generating apparatus, a method of generating characters in a complex character set on a utilization device with each character in said complex character set being described by elements in an original m by n element matrix, where m and n are integers which may or may not be equal, said method comprising the steps of:
    defining, in terms of elements, a plurality of different patterns which occur frequently in said complex character set;
    assigning a different symbol to represent each one of said different patterns; defining a sparse m by n character matrix for each character in said complex character set in terms of the symbols representing the combination of said different patterns forming the corresponding original character matrix, with each pattern position in a given character being represented by the assigned symbol for that pattern, with each symbol being positioned in the sparse matrix where a predetermined one of the elements in the corresponding pattern in the original character matrix is positioned;
    storing in binary form in a storage device each sparse matrix representation in said complex character set as a compacted character, with the information stored for each compacted character being: (a) the symbols in the sparse matrix, (b) the positions of the symbols in the sparse matrix, and (c) the size parameters of the pattern represented by the symbol, if the symbol represents a family of patterns which differ only in size; and
    generating on said utilization device a given complex character in response to retrieving and decoding the binary information stored which defines the corresponding compacted complex character.

2. In character generating apparatus, a method of generating characters in a complex character set on a utilization device, with each character in said complex character set being described by an original m by n element matrix, where m and n are integers which may or may not be equal, said method comprising the steps of:
    defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern;
    assigning a different symbol to represent each one of said different patterns;
    defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix;
    storing in binary form in a storage device each sparse matrix representation in said complex character set as a compacted character, with the binary information stored for each compacted character being: (a) the symbols in the sparse matrix, (b) the positions of the symbols in the sparse matrix, and (c) the size parameters of the pattern represented by the symbol, if the symbol is in said second or third groups of patterns; and
    generating on said utilization device a given complex character in response to retrieving and decoding the binary information stored which defines the corresponding compacted complex character.

3. In character generating apparatus, a method of generating characters in a Kanji character set on a utilization device, with each character in said Kanji character set being described by an original m by n element matrix, where m and n are integers which may or may not be equal, said method comprising the steps of:
    defining in terms of elements, three groups of different patterns which occur frequently in said Kanji character set, namely, a first group which has a fixed size for each pattern, a second group which has one size parameter which must be specified for each pattern, and a third group which has two size parameters which must be specified for each pattern;
    assigning a different symbol to represent each one of said different patterns;
    defining a sparse m by n character matrix for each character in said Kanji character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix;

storing in binary form in a storage device each sparse matrix representation in said Kanji character set as a compacted character, with the binary information stored for each compacted character being: (a) the symbols in the sparse matrix, (b) the positions of the symbols in the sparse matrix, and (c) the size parameters of the pattern represented by the symbol, if the symbol is in said second or third groups of patterns; and generating on said utilization device a given Kanji character in response to retrieving and decoding the information stored which defines the corresponding compacted Kanji character.

4. In character generating apparatus, a method of generating characters in a complex character set on a utilization device, with each character in said complex character set being described by an original m by n element matrix, where m and n are integers which may or may not be equal, said method comprising the steps of:

defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern;

assigning a different symbol to represent each one of said different patterns;

defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix;

storing in binary form in a read only storage device each sparse matrix representation in said complex character set as a compacted character, with the information stored for each compacted character being: (a) the symbols in the sparse matrix, (b) the positions of the symbols in the sparse matrix, and (c) the size parameters of the pattern represented by the symbol, if the symbol is in said second or third groups of patterns;

storing in a first memory device information needed to generate each of said different patterns contained in said three groups of patterns;

storing information relative to: (d) in a second memory device all of the different symbols, (e) in a third memory device all of the positions in the sparse matrix, and (f) in a fourth memory device all of the size parameters specified for the patterns in said second and third groups of patterns;

retrieving the information stored which defines a given compacted character; and responding to the retrieved information relative to said given compacted character by the information stored relative to (d), (e), and (f) above and the information stored to generate each of said different patterns for generating the original character corresponding to said compacted character.

5. In character generating apparatus, a method of generating characters in a complex character set, with each character in said complex character set being described by an original m by n element matrix, where m and n are integers which may or may not be equal, said method comprising the steps of:

defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern;

assigning a different symbol to represent each one of said different patterns;

defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix;

storing in a first memory location each sparse matrix representation in said complex character set as a compacted character, with the information stored for each compacted character being: (a) the symbols in the sparse matrix, (b) the positions of the symbols in the sparse matrix, and (c) the size parameters of the pattern represented by the symbol, if the symbol is in said second or third groups of patterns;

storing in a second memory location information needed to specify all of the positions in a sparse matrix;

storing in a third memory location information needed to specify all of the different symbols;

storing in a fourth memory location information needed to generate each of said different patterns in response to having the symbol indicative of a given pattern specified by the symbol information stored in said third memory location;

storing in a fifth memory location information needed to specify all of the size parameters necessary for generating the patterns in said second and third groups of patterns;

retrieving the information stored in said first memory location which defines a given compacted character;

responding to the retrieved information by the information stored in said second memory location for determining each of the positions of all of the symbols in the sparse matrix defined by said given compacted character;

responding to the retrieved information by the information stored in said third memory location for determining each of the symbols in the sparse matrix defined by said given compacted character;

responding to the retrieved information by the information stored in said fifth memory location for specifying the size parameters of any patterns in said first and second group of patterns as specified by the retrieved information; and responding to the symbols specified by the information stored in said third memory location by the pattern information stored in said fourth memory location, for generating the corresponding patterns at the positions specified by the information stored in said second memory location, with size parameters, if needed, as specified by the size parameter information stored in said fifth memory location, with the generated patterns producing the original character corresponding to the compacted character.

6. A method of generating characters in a complex character set, with each character in said complex character set being described by an original m by n element matrix, where m and n are integers which may or may not be equal, said method comprising the steps of:

defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern;

assigning a different symbol to represent each one of said different patterns;

defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix;

storing in a read-only storage device each sparse matrix representation in said complex character set as a compacted character in binary bit form, with the information stored for each compacted character being: (a) information indicative of the symbols in the sparse matrix, (b) information indicative of the positions of the symbols in the sparse matrix in I and J mutually orthogonal directions, and (c) the size parameters in terms of I and J of the pattern represented by the symbol, if the symbol is representative of a pattern in said second or third groups of patterns;

retrieving a given compacted character from said read-only storage device;

responding to the successive bits representative of the retrieved compacted character, by a first read-only memory device which has all I0, J0 positions stored at predetermined locations therein, to determine the I0, J0 position of each symbol in the sparse matrix representation of said given compacted character;

storing in a first latch the successive I0 positions specified by said first read-only memory;

storing in a second latch the successive J0 positions specified by said first read-only memory;

responding to the successive bits representative of the retrieved compacted character, by a second read-only memory device which has all symbol information stored at predetermined locations therein, to determine each symbol in the sparse matrix representation of said given compacted character;

responding to the successive bits representative of the retrieved compacted character, by a third read-only memory device which has all size parameter information relative to said second and third groups of patterns stored at predetermined locations therein, to determine the size parameter of each pattern in said second and third groups specified by the symbols in the sparse matrix representative of said given compacted character;

storing in a third latch the successive I size parameters specified by said third read-only memory device;

storing in a fourth latch the successive J size parameters specified by said third read-only memory device;

responding to each symbol specified by said second read-only memory device, by a fourth read-only device which has information stored therein at predetermined locations for generating each of the patterns in said first, second and third groups of patterns, to provide control signals necessary to generate each of the patterns corresponding to the symbols specified by said second read-only memory device;

responding to said control signals from said fourth read-only memory device by a first counter to count the successive I positions necessary to generate a given pattern;

comparing the count manifested by said first counter with the size parameter stored in said third latch whenever a size parameter is required, with said fourth read-only memory device receiving a comparison signal when the count in said first counter equals the size parameter stored in said third latch;

adding the successive I0 positions stored in said first latch with the successive counts manifested by said first counter to provide a first signal indicative of the successive I parameters of the patterns specified by said fourth read-only memory device;

responding to said control signals from said fourth read-only memory device by a second counter to count the successive J positions necessary to generate a given pattern;

comparing the count manifested by said second counter with the size parameter stored in said fourth latch whenever a size parameter is required, with said fourth read-only memory device receiving a comparison signal when the count in said second counter equals the size parameter stored in said fourth latch;

adding the successive J0 positions stored in said second latch with the successive counts manifested by said second counter to provide a second signal indicative of the successive J parameters of the patterns specified by said fourth read-only memory device; and producing the original character described by said compacted character in response to the provision of said first and second signals.

7. In a character generator for a complex character set, wherein each character in said complex character set is described by elements in an original m by n element matrix, where m and n are integers which may or may not be equal, a defined sparse matrix representation for each character, with a plurality of different patterns which occur in said complex character set being defined in terms of said elements, with a different symbol being assigned to represent each one of said different patterns, and with each sparse m by n character matrix for each character in said character set being defined in terms of said symbols representing the combination of said different patterns forming the corresponding original matrix, with each pattern position in a given character being represented by the assigned symbol for that pattern, with each symbol being positioned in the sparse matrix where a predetermined one of the elements in the corresponding pattern in the original matrix is positioned, the combination comprising:
- a storage device in which each sparse matrix representation in said complex character set is stored as a compacted character, with the information stored for each compacted character being, (a) the symbols in the sparse matrix, (b) the positions of the symbols in the sparse matrix, and (c) the size parameters of the pattern represented by the symbol, if the symbol represents a family of patterns which differ only in size;
- means for retrieving a given compacted character from said storage device;
- memory means, responsive to the retrieved compacted character, in which all of said patterns are stored, all of said m by n positions are stored, and said size parameters are stored, including means for reconstructing the original character from said retrieved given compacted character; and
- a utilization device on which said reconstructed original character is manifested.

8. In a character generator for a complex character set, wherein each character in said complex character set is described by elements in an original m by n element matrix, where m and n are integers which may or may not be equal, a defined sparse matrix representation for each character, with a plurality of different patterns which occur in said complex character set being defined in terms of said elements, with a different symbol being assigned to represent each one of said different patterns, and with each sparse m by n character matrix for each character in said character set being defined in terms of said symbols representing the combination of said different patterns forming the corresponding original matrix, with each pattern position in a given character being represented by the assigned symbol for that pattern, with each symbol being positioned in the sparse matrix where a predetermined one of the elements in the corresponding pattern in the original matrix is positioned, the combination comprising:
- a storage device in which each sparse matrix representation in said complex character set is stored as a compacted character, with the information stored for each compacted character being, (a) the symbols in the sparse matrix, (b) the positions of the symbols in the sparse matrix, and (c) the size parameters of the pattern represented by the symbol, if the symbol represents a family of patterns which differ only in size;
- a first memory device in which is stored information needed to generate each of said different patterns;
- a second memory device in which is stored all of said different symbols;
- a third memory device in which is stored all of the positions in said sparse matrix;
- a fourth memory device in which is stored the size parameters;
- means for retrieving a given one of said compacted characters from said storage device;
- means operative with said first through fourth memory devices for responding to the retrieved compacted character for reconstructing the corresponding original character; and
- a utilization device on which the reconstructed original character is manifested.

9. In a complex character generator for generating a complex character set, with each character in said complex character set being described by an original m by n element matrix, where m and n are integers which may or may not be equal, defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern, assigning a different symbol to represent each one of said different patterns, defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix, the combination comprising:
- a storage device in which each sparse matrix representation in said complex character set is stored as a compacted character, with the information stored for each compacted character being: (a) the symbols in the sparse matrix, (b) the positions of the symbols in the sparse matrix, and (c) the size parameters of the pattern represented by the symbol, if the symbol is in said second or third groups of patterns;
- a first memory means in which information needed to generate each of said different patterns contained in said three groups of patterns is stored;
- a second memory means in which information is stored relative to: (d) all of the different symbols, (e) all of the positions in the sparse matrix, and (f) all of the size parameters specified for the patterns in said second and third groups of patterns;
- means for retrieving the information stored which defines a given compacted character; and
- means for responding to the retrieved information relative to said given compacted character by the information stored in said second memory means relative to (d), (e), and (f) above and the information stored in said first memory means to generate each of said different patterns for generating the original character corresponding to said compacted character.

10. In a complex character generator for generating a complex character set, with each character in said complex character set being described by an original m by n element matrix, where m and n are integers which may or may not be equal, defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern, assigning a different symbol to represent each one of said different patterns, defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix, the combination comprising:

a storage device in which each sparse matrix representation in said complex character set is stored as a compacted character, with the information stored for each compacted character being: (a) the symbols in the sparse matrix, (b) the positions of the symbols in the sparse matrix, and (c) the size parameters of the pattern represented by the symbol, if the symbol is in said second or third groups of patterns;

a first memory device in which is stored information needed to specify all of the positions in a sparse matrix;

a second memory device in which is stored information needed to specify all of the different symbols;

a third memory device in which is stored information needed to generate each of said different patterns in response to having the symbol indicative of a given pattern specified by the symbol information stored in said second memory device, a fourth memory device in which is stored information needed to specify all of the size parameters necessary for generating the patterns in said second and third groups of patterns;

means for retrieving the information stored in said storage device which defines a given compacted character;

means for responding to the retrieved information by the information stored in said first memory device for determining each of the positions of all of the symbols in the sparse matrix defined by said given compacted character;

means for responding to the retrieved information by the information stored in said second memory device for determining each of the symbols in the sparse matrix defined by said given compacted character;

means for responding to the retrieved information by the information stored in said fourth memory device for specifying the size parameters of any patterns in said first and second group of patterns as specified by the retrieved information; and means for responding to the symbols specified by the information stored in said second memory device by the pattern information stored in said third memory device for generating the corresponding patterns at the positions specified by the information stored in said first memory device, with size parameters, if needed, as specified by the size parameter information stored in said fourth memory device, with the generated patterns producing the original character corresponding to the compacted character.

11. In a complex character generator for generating a complex character set, with each character in said complex character set being described by an original m by n element matrix, where m and n are integers which may or may not be equal, defining in terms of elements, three groups of different patterns which occur frequently in said complex character set, namely, a first group which has a fixed size for each pattern, a second group which has one size parameter which must be specified for each pattern, and a third group which has two size parameters which must be specified for each pattern, assigning a different symbol to represent each one of said different patterns, defining a sparse m by n character matrix for each character in said complex character set in terms of the combination of symbols assigned to represent the combination of patterns defining the corresponding original character matrix, with each symbol being positioned in the sparse matrix where a predetermined one of the elements forming the pattern defined by that symbol is positioned in the original character matrix, the combination comprising:

a read-only storage device in which is stored each sparse matrix representation in said complex character set as a compacted character in binary bit form, with the information stored for each compacted character being: (a) information indicative of the symbols in the sparse matrix, (b) information indicative of the positions of the symbols in the sparse matrix in I and J mutually orthogonal directions, and (c) the size parameters in terms of I and J of the pattern represented by the symbol, if the symbol is representative of a pattern in said second or third groups of patterns;

means for retrieving a given compacted character from said read-only storage device;

a first read-only memory device which has all I0, J0 positions stored at predetermined locations therein and which responds to the successive bits representative of the retrieved compacted character, to determine the I0, J0 position of each symbol in the sparse matrix representation of said given compacted character;

a first latch in which is stored the successive I0 positions specified by said first read-only memory device;

a second latch in which is stored the successive J0 positions specified by said first read-only memory device;

a second read-only device which has all symbol information stored at predetermined locations therein and which responds to the successive bits representative of the retrieved compacted character, to determine each symbol in the sparse matrix representation of said given compacted character;

a third read-only memory device which has all size parameter information relative to said second and third groups of patterns stored at predetermined locations therein and which responds to the successive bits representative of the retrieved compacted character, to determine the size parameter of each pattern in said second and third groups specified by the symbols in the sparse matrix representative of said given compacted character;

a third latch in which is stored the successive I size parameters specified by said third read-only memory device;

a fourth latch in which is stored the successive J size parameters specified by said third read-only memory device;

a fourth read-only memory device which has information stored therein at predetermined locations for generating each of the patterns in said first, second and third groups of patterns and which responds to each symbol specified by said second read-only memory device, to provide control signals necessary to generate each of the patterns corresponding to the symbols specified by said second read-only memory device;

a first counter which responds to said control signals from said fourth read-only memory device to count the successive I positions necessary to generate a given pattern;

a first comparater for comparing the count manifested by said first counter with the size parameter stored in said third latch whenever a size parameter is required, with said fourth read-only memory device receiving a comparison signal when the count in said first counter equals the size parameter stored in said third latch;

a first adder for adding the successive I0 positions stored in said first latch with the successive counts manifested by said first counter to provide a first signal indicative of the successive I parameters of the patterns specified by said fourth read-only memory device;

a second counter which responds to said control signals from said fourth read-only memory device to count the successive J positions necessary to generate a given pattern;

a second comparator for comparing the count manifested by said second counter with the size parameter stored in said fourth latch whenever a size parameter is required, with said fourth read-only memory device receiving a comparison signal when the count in said second counter equals the size parameter stored in said fourth latch;

a second adder for adding the successive J0 positions stored in said second latch with the successive counts manifested by said second counter to provide a second signal indicative of the successive J parameters of the patterns specified by said fourth read-only memory device; and means for producing the original character described by said compacted character in response to the provision of said first and second signals.

* * * * *